United States Patent
Lee (10) Patent No.: US 7,289,946 B1
(45) Date of Patent: Oct. 30, 2007

(54) METHODOLOGY FOR VERIFYING MULTI-CYCLE AND CLOCK-DOMAIN-CROSSING LOGIC USING RANDOM FLIP-FLOP DELAYS

(75) Inventor: Hin-Kwai Lee, Fremont, CA (US)

(73) Assignee: Neo Magic Corp., Santa Clara, CA (US)

( * ) Notice: Subject to any disclaimer, the term of this patent is extended or adjusted under 35 U.S.C. 154(b) by 658 days.

(21) Appl. No.: 10/604,879

(22) Filed: Aug. 22, 2003

(51) Int. Cl.
*G06F 17/50* (2006.01)
*G06F 11/00* (2006.01)
*G01R 31/28* (2006.01)

(52) U.S. Cl. .................. 703/16; 714/741; 714/731; 714/744; 714/724

(58) Field of Classification Search .......... 703/16; 714/724, 732, 741, 744
See application file for complete search history.

(56) References Cited

U.S. PATENT DOCUMENTS

| | | | | |
|---|---|---|---|---|
| 4,744,084 A | 5/1988 | Beck et al. | ........... | 714/33 |
| 5,095,454 A | 3/1992 | Huang | ........... | 703/19 |
| 5,365,463 A | 11/1994 | Donath et al. | ........... | 703/19 |
| 5,608,645 A | 3/1997 | Spyrou | ........... | 716/6 |
| 5,651,012 A | 7/1997 | Jones | ........... | 714/724 |
| 5,826,061 A | 10/1998 | Walp | ........... | 716/1 |
| 5,850,355 A | 12/1998 | Molnar | ........... | 703/15 |
| 5,867,691 A | 2/1999 | Shiraishi | ........... | 713/400 |
| 6,088,821 A * | 7/2000 | Moriguchi et al. | ........... | 714/724 |
| 6,338,127 B1 | 1/2002 | Manning | ........... | 711/167 |
| 6,353,906 B1 * | 3/2002 | Smith et al. | ........... | 714/741 |
| 6,408,265 B1 | 6/2002 | Schultz et al. | ........... | 703/22 |
| 6,430,731 B1 | 8/2002 | Lee et al. | ........... | 716/6 |
| 6,877,123 B2 * | 4/2005 | Johnston et al. | ........... | 714/731 |

OTHER PUBLICATIONS

Schmid et al. "Advanced Synchronous Scan Test Methodology for Multi Clock Domain ASICs" Apr. 1999.*
Cummings, Clifford. "Syntheses and Scripting Techniques for Designing Multi-Asynchronous Clock Designs" Sunburst Design, 2001.*

* cited by examiner

*Primary Examiner*—Kamini Shah
*Assistant Examiner*—Shambhavi Patel
(74) *Attorney, Agent, or Firm*—gPatent LLC; Stuart T. Auvinen

(57) ABSTRACT

A design tool inserts randomized delays into synchronizers for signals crossing from one clock domain to another. Rather than having a wide range of random delays to select from, each synchronizer's randomized delay is selected from only two possibilities. An added delay of either zero or one clock period of the new domain's clock is added as the randomized delay. The randomized delay causes the re-synchronized domain-crossing signal to become available either in the expected cycle or in the cycle following the expected cycle. Logic hazards caused by the domain-crossing signal can be detected and the possible results simulated. The synchronizer can be a series of two flip-flops, with the random delay added to the first flip-flop. Randomized delays of either one or none added periods of the clock can also be added to multi-cycle signals within one clock domain that have two or more clock cycles to propagate.

18 Claims, 8 Drawing Sheets

PRIOR ART

FIG. 1

PRIOR ART

PRIOR ART

FIG. 4B

PRIOR ART

FIG. 5

FIG. 6A  FF_DEL_1 = 0

FIG. 6B  FF_DEL_1 = T2

METHODOLOGY FOR VERIFYING MULTI-CYCLE AND CLOCK-DOMAIN-CROSSING LOGIC USING RANDOM FLIP-FLOP DELAYS

BACKGROUND OF INVENTION

This invention relates to design verification of digital electronic systems, and more particularly to timing verifiers.

Large electronic systems can be integrated onto a single silicon substrate using advanced semiconductor manufacturing processes. A wide variety of design tools are available to help designers capture and verify these designs before committing to manufacture of prototypes. These design tools have enabled designers to build larger and larger electronic systems with about the same design effort.

Verification of larger designs can be challenging. Large chips such as System-On-a-Chip (SOC) may have several major sub-system blocks, such as core logic, state machines, memories, processor cores, graphics engines, etc. Some of these large blocks may have been designed earlier by other design teams or even by other companies and can differ in details such as clock rates. This can pose challenges when signals from one block cross over to another block that operates at a different clock rate.

Figure 1:
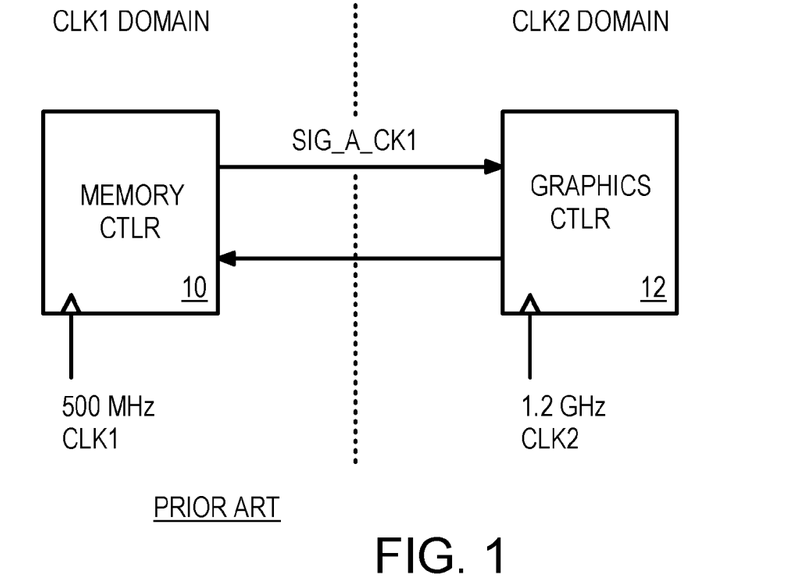
FIG. 1 highlights functional blocks that operate at different clock rates in a large design.

FIG. 1 highlights functional blocks that operate at different clock rates in a large design. Memory controller 10 receives and processes requests from other blocks, such as from graphics controller 12, for access of one or more memories. Memory controller 10 receives a 500 MHz clock CLK1, which is used to clock the various state machines, data paths, and control signals in memory controller 10.

Graphics controller 12 may need to operate at a different clock rate than memory controller 10. For example, graphics controller 12 may drive pixels to a display at a fixed rate determined by the display device and the graphics mode and resolution selected. In this example, graphics controller 12 receives a 1.2 GHz clock CLK2, which is divided down to produce pixel clocks, line clocks, horizontal and vertical refresh sync signals, etc.

Memory controller 10 is said to be in the CLK1 domain, while graphics controller 12 is in the CLK2 domain. Signals such as SIG_A_CK1 that pass from memory controller 10 to graphics controller 12 are clock-domain-crossing signals. Special care must be taken for these domain-crossing signals to ensure that they are re-synchronized to the new clock domain. Metastability and system failures could occur if these domain-crossing signals are not properly re-synchronized.

Figure 2:
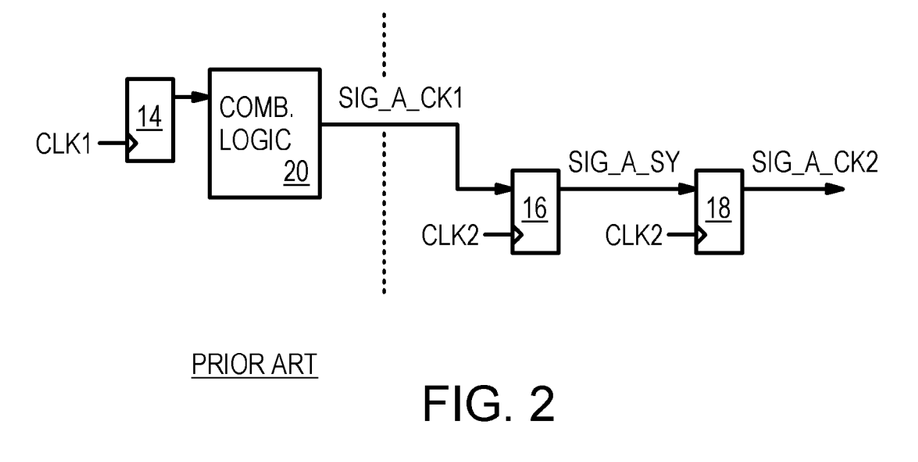
FIG. 2 shows a signal from one clock domain being re-synchronized to a new clock domain.

FIG. 2 shows a signal from one clock domain being re-synchronized to a new clock domain. One technique to re-synchronize domain-crossing signals is known as "double flopping". The domain-crossing signal SIG_A_CK1 is generated by combinatorial logic 20 from a signal driven by flip-flop 14. Since flip-flop 14 is clocked by CLK1, SIG_A_CK1 is in the CLK1 domain and synchronized to CLK1.

When SIG_A_CK1 crosses into the CLK2 domain, it first passes through a pair of flip-flops 16, 18 that are each clocked by CLK2. An entire CLK2 cycle period is available for the intermediate signal SIG_A_SY to settle from any metastability of first flip-flop 16 caused by SIG_A_CK1 being asynchronous to CLK2. The output SIG_A_CK2 of second flip-flop 18 is more likely to be stable than the intermediate signal SIG_A_SY output by first flip-flop 16, since the intermediate signal is not sampled until one CLK2 period after the CLK1 domain signal was sampled by first flip-flop 16.

Similar double-flopping synchronizers can be placed on each signal crossing from one clock domain to another. This can greatly reduce metastability problems. However, other problems can still occur with domain-crossing signals.

Figure 3:
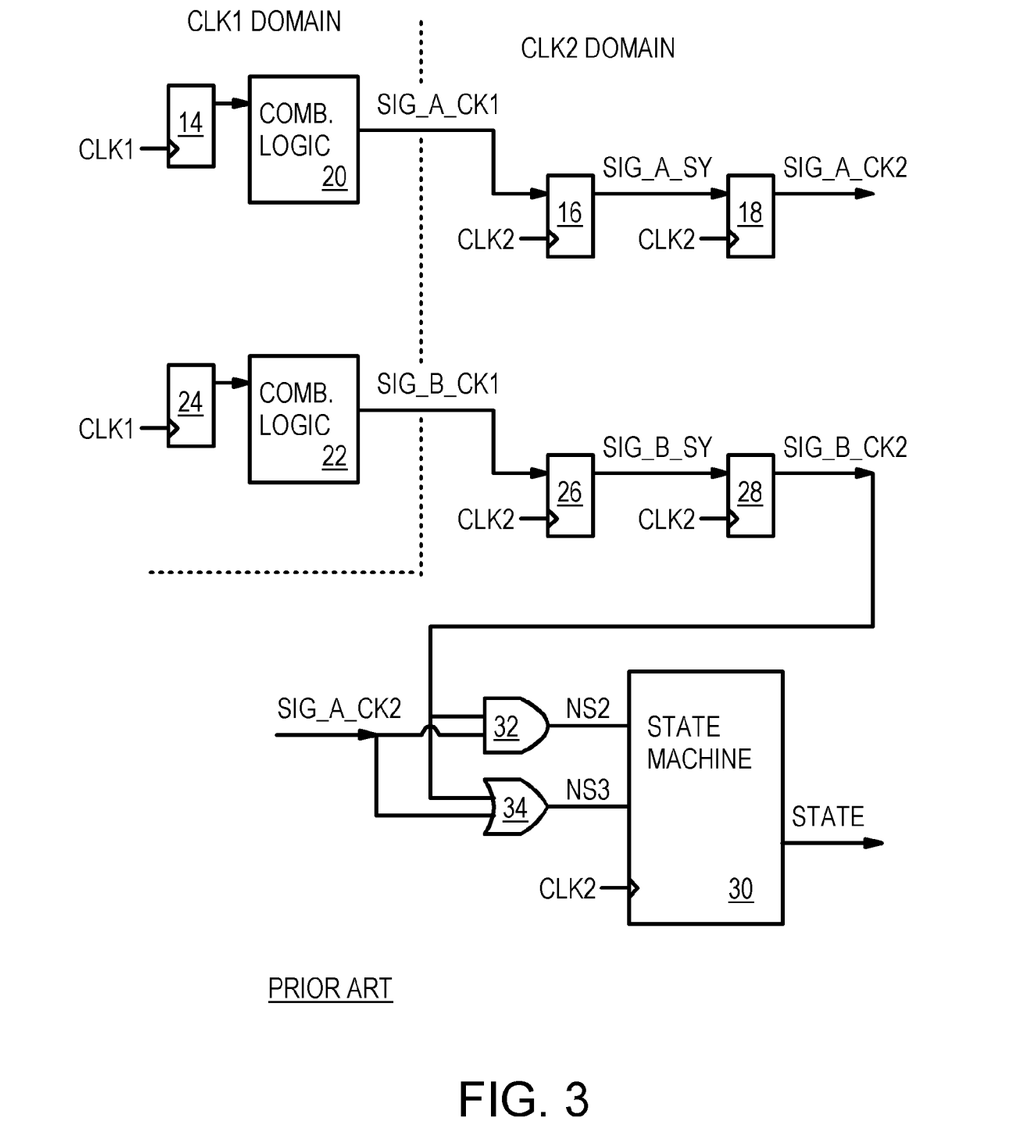
FIG. 3 highlights a logic hazard caused by logic that combines re-synchronized clock-domain-crossing signals.

FIG. 3 highlights a logic hazard caused by logic that combines re-synchronized clock-domain-crossing signals. Timing hazards can occur when domain-crossing signals are combined after synchronization. Such problems occur when the domain-crossing signals are sampled in different clock periods of the new clock. Although the synchronized domain-crossing signals are not metastable, they may become valid in different clock periods, depending on whether the domain-crossing signal was sampled by the first flip-flop of the synchronizer before or after a clock edge occurs.

Two signals, SIG_A_CK1 and SIG_B_CK1, are generated in the CLK1 domain. SIG_A_CK1 is generated by combinatorial logic 20 from the output of flip-flop 14, which is clocked by CLK1. SIG_B_CK1 is generated by combinatorial logic 22 from the output of flip-flop 24, which is also clocked by CLK1. However, combinatorial logic 22 may have a larger delay than combinatorial logic 20, causing SIG_B_CK1 to be generated with a larger delay from the CLK1 edge than SIG_A_CK1.

The larger delay of combinatorial logic 22 may cause SIG_B_CK1 to arrive at the D-input to flip-flop 26 after the next CLK2 edge, while the shorter delay of combinatorial logic 20 may allow SIG_A_CK1 to arrive at the D-input to flip-flop 16 before the next CLK2 edge. Thus there is an extra CLK2 period of synchronizing delay for SIG_B_CK1 than for SIG_A_CK1.

SIG_A_CK1 is delayed by one CLK2 period and synchronized by flip-flops 16, 18, producing SIG_A_CK2. SIG_B_CK1 is also delayed by one CLK2 period and synchronized by flip-flops 26, 28, producing SIG_B_CK2. However, SIG_B_CK2 can be one CLK2 clock period behind SIG_A_CK2, or theses signals can be generated at the same time, when the delays of combinatorial logic 20, 22 are more closely matched, or the delay to the next CLK2 edge is longer.

The exact relative timing of SIG_A_CK1 and SIG_B_CK1 is thus uncertain early in the design cycle. The delays are dependent on final wiring line lengths and other parameters that may not be known until the design is routed or even manufactured.

The re-synchronized signals SIG_A_CK2 and SIG_B_CK2 are combined within the CLK2 domain by AND gate 32 and OR gate 34. Gates 32, 34 produce inputs to state machine 30, which is clocked by CLK2 or a derivative. State machine 30 may advance to state 2 when AND gate 32 drives NS2 high, but advance to a different state 3 when OR gate 34 drives NS3 high.

Figure 4A:
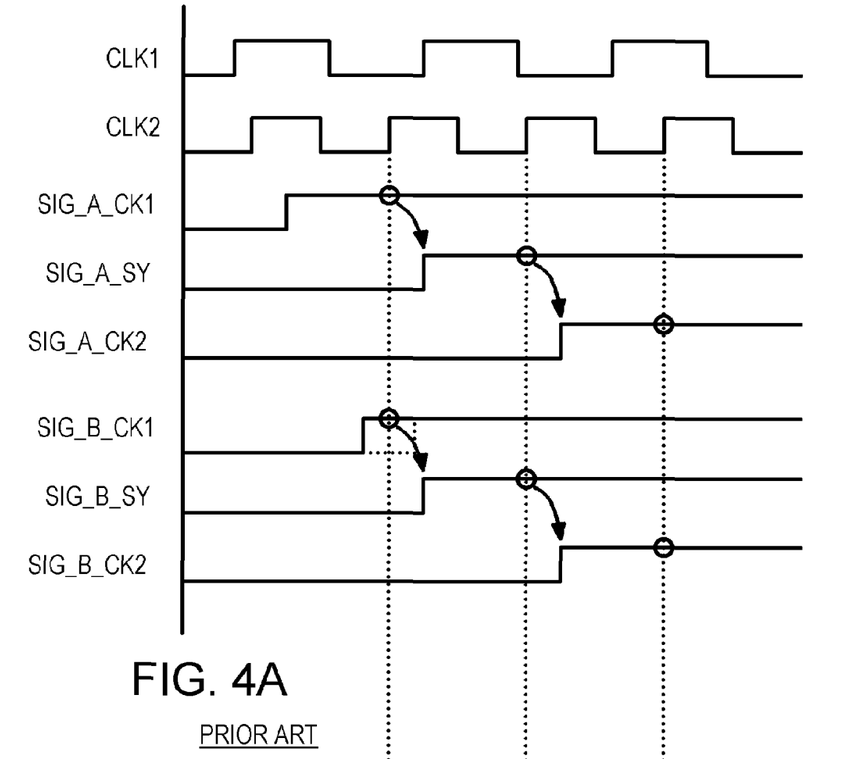
FIG. 4A is a timing diagram illustrating a state machine entering an expected state in response to re-synchronized domain-crossing signals.

FIG. 4A is a timing diagram illustrating a state machine entering an expected state in response to re-synchronized domain-crossing signals. Signals SIG_A_CK1 and SIG_B_CK1 are generated from the same (first) CLK1 rising edge in the waveform. SIG_B_CK1 is generated with a larger delay than SIG_A_CK1, perhaps due to longer delays in combinatorial logic after the CLK1 flip-flop, due to longer lines, or due to higher-capacitance loads.

Both SIG_A_CK1 and SIG_B_CK1 arrive sufficiently before the next CLK2 rising edge so that they meet the set-up time requirement and change the state of the first flip-flops in each synchronizer. Thus both SIG_A_SY and SIG_B_SY go high after the rising CLK2 edge. The outputs SIG_A_CK2 and SIG_B_CK2 of the second flip-flops in each synchronizer go high on the following CLK2 rising edge, at the second dotted vertical line from the left in the figure.

The state machine in the CLK2 domain combines the re-synchronized signals SIG_A_CK2 and SIG_B_CK2 to determine what state to enter next. Since both SIG_A_CK2 and SIG_B_CK2 are high at the third CLK2 rising edge (right-most dotted vertical line), the state machine enters state 2. This is the desired or expected state.

Figure 4B:
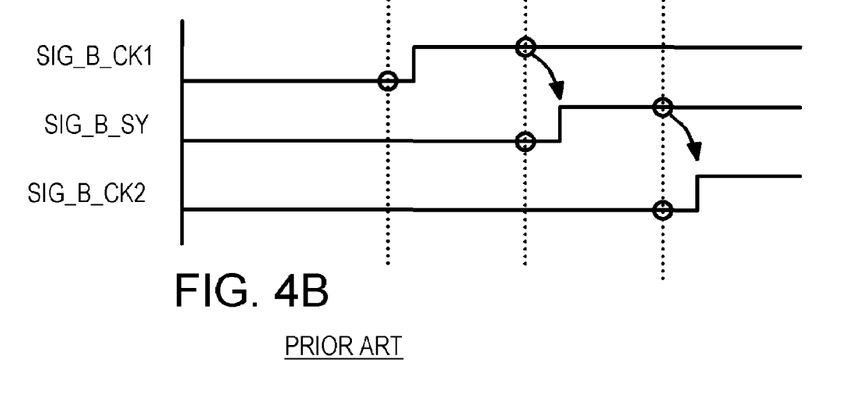
FIG. 4B is a timing diagram illustrating a state machine entering an un-expected state in response to varying delays of re-synchronized domain-crossing signals.

FIG. 4B is a timing diagram illustrating a state machine entering an un-expected state in response to varying delays of re-synchronized domain-crossing signals. Signal A is synchronized as shown for FIG. 4A. However, signal B is delayed further and misses the CLK2 rising edge.

The delay for generating SIG_B_CK1 is slightly longer than in FIG. 4A. SIG_B_CK1 is still low when the CLK2 rising edge occurs that samples SIG_A_CK1 high (leftmost dotted vertical line). SIG_B_SY remains low for another CLK2 period. SIG_B_CK1 is finally sampled high on the next CLK2 rising edge, at the middle dotted vertical line. Then SIG_B_SY goes high, one CLK2 period later than in FIG. 4A. SIG_B_CK2 finally goes high another CLK2 period later, at the left-most dotted vertical line.

At the left-most dotted line, the state machine examines the re-synchronized signals SIG_A_CK2 and SIG_B_CK2 to determine what state to enter next. Rather than both SIG_A_CK2 and SIG_B_CK2 being high, only SIG_A_CK2 is high. SIG_B_CK2 is still low, since SIG_B_CK1 missed being clocked by the second CLK2 rising edge at the left-most dotted line in the figure.

The SIG_A_CK2 and SIG_B_CK2 signals are sampled high/low, causing the AND gate (NS2) to be low and the OR gate (NS3) to be high. The state machine then enters state 3 rather than the expected state 2. The wrong state is entered due to the slight shift in the SIG_B_CK1 signal, causing it to miss being sampled by the same CLK2 edge as SIG_A_CK1.

The state machine entering state 3 may be un-expected and even un-desired. The designer may expect that both SIG_A_CK2 and SIG_B_CK2 go high at the same time, rather than one CLK2 period later. The designer can redesign the state machine to account for this behavior if he is aware of the hazard. Unfortunately, the designer may not be aware of this timing hazard, since the designer may not have designed the blocks in the CLK1 domain.

In this simple example of two high-going signals, there are four possible combinations of the re-synchronized A and B signals:

1.) SIG_A_CK1 and SIG_B_CK1 both arrive before the CLK2 edge. Then SIG_A_CK2 and SIG_B_CK2 are both sampled high (11).

2.) SIG_A_CK1 arrives before CLK2 but SIG_B_CK1 arrives after the CLK2 edge. Then SIG_A_CK2 is sampled high but SIG_B_CK2 is sampled low (10).

3.) SIG_A_CK1 and SIG_B_CK1 both arrive after the CLK2 edge. Then SIG_A_CK2 and SIG_B_CK2 are both sampled low (00).

4.) SIG_A_CK1 arrives after the CLK2 edge but SIG_B_CK1 arrives before the CLK2 edge. Then SIG_A_CK2 is sampled low but SIG_B_CK2 is sampled high (01).

Many other combinations of signals and relative timings can occur on a large design. Keeping track of these many possible logic hazards is difficult and tedious. Early in the design cycle the exact delays may not be known. Failures may not be observed during early simulation with idealized delays, but may appear later when better delay models using wiring-trace lengths and output loads are added. By then it may be difficult to change the design to prevent the hazard.

Even once better R-C delay models are used for simulation, the synchronizing hazards may still appear in the future, such as when a design is moved to a new manufacturing process or when the clock frequencies used are changed. Oftentimes successful chips are updated to newer processes or use with faster clocks than was originally intended or simulated.

A more automated approach to discovering where these re-synchronizing hazards occur and what can happen to the down-stream logic is desirable. A logic verifier that can better simulate such logic hazards that can occur with clock-domain-crossing signals is desired.

DETAILED DESCRIPTION

The present invention relates to an improvement in logic or timing verifiers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that logic hazards can exist when domain-crossing signals are re-combined in the new domain. Synchronizers can prevent metastability on domain-crossing signals, but cannot prevent the combinatorial logic hazards.

The inventor further realizes that random delays can be added to the synchronizer path or flip-flops. These random delays can help detect these logic hazards since the hazards may appear as failures or signal mismatch with expected results for certain combinations of delays.

While a range of random delays could be added to the flip-flop delays and simulated, the inventor has realized that each re-synchronized can be sampled in only one of two states—high or low—at any given time, assuming metastability is prevented by the synchronizer. Thus only two random delay values are needed—one to cause a signal to be sampled in the high state, and another for the signal to be sampled in the low state. A short delay can allow the synchronizer to sample the domain-crossing signal after the signal has changed, while a long delay causes the synchronizer to sample the signal before the change has propagated.

The inventor realizes that an additional delay of one period of the new-domain clock can be added to simulate the long delay, but not added to simulate the short delay. Thus the inventor randomly either adds or does not add a one-clock-period delay to signals sampled by domain-crossing synchronizers to test for domain-crossing logic hazards. Rather than add a truly random delay time, a fixed delay of one clock period is randomly added or not added.

Figure 5:
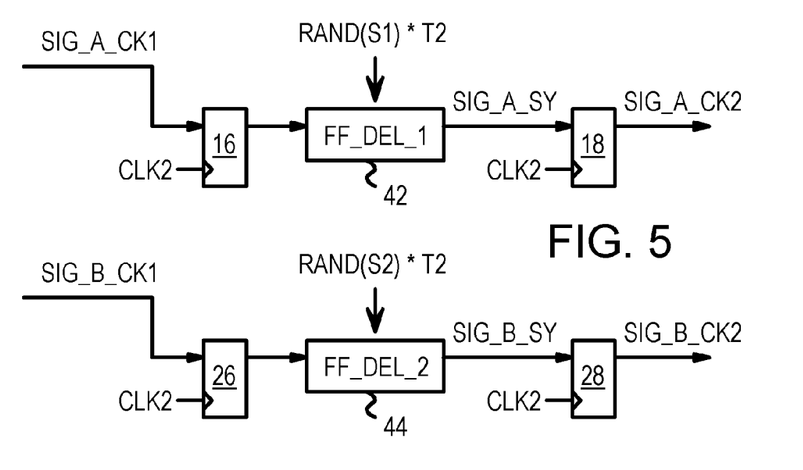
FIG. 5 shows domain-crossing synchronizers that have one-clock-period delays randomly added for simulating hazards.

FIG. 5 shows domain-crossing synchronizers that have one-clock-period delays randomly added for simulating hazards. Signals SIG_A_CK1 and SIG_B_CK1 are generated in the CLK domain but cross over to the CLK2 domain. SIG_A_CK1 is synchronized by flip-flops 16, 18 both clocked by CLK2 to generate re-synchronized signal SIG_A_CK2. Likewise, signal SIG_B_CK1 is synchronized by flip-flops 26, 28 both clocked by CLK2 to generate re-synchronized signal SIG_B_CK2.

Each of flip-flops 16, 18, 26, 28 has a clock-to-output propagation delay that is arbitrarily set to 1 or to some other value. However, first flip-flop 16 has randomized delay 42 added as an additional delay before signal SIG_A_SY reaches the D-input of second flip-flop 18. Randomized delay 42 can be generated by a random function RAND operating on an initial seed S1 to randomly generate either 0 or 1. The result of RAND(S1) is multiplied by the period of CLK2, T2. The randomized delay, either 0 or T2, is added by randomized delay 42 to the delay of first flip-flop 16 so that the total delay from CLK2 to SIG_A_SY is either 1 or is 1+T2.

First flip-flop 26 that synchronizes SIG_B_CK1 also has a randomized delay added to propagation of SIG_B_SY by randomized delay 44. A different seed S2 can be used for the RAND function that generates the delay for randomized delay 44.

The delays of first flip-flops 16, 26 are randomly assigned by randomized delays 42, 44 so that the combination of delays for flip-flops 16, 26 is one of four possibilities: (1, 1), (1, 1+T2), (1+T2, 1), or (1+T2, 1+T2).

Figure 6A:
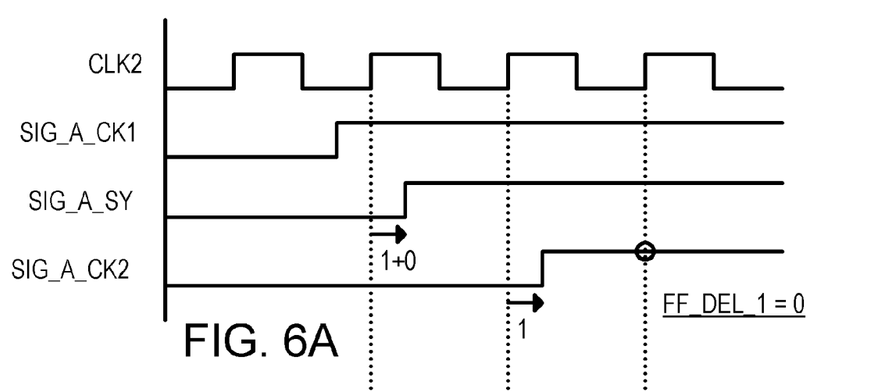
FIGS. 6A, 6B are waveforms showing randomized delays added to domain-crossing signals.
Figure 6B:
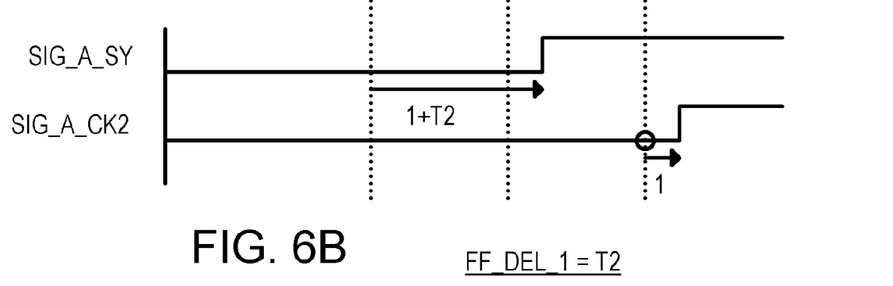

FIGS. 6A, 6B are waveforms showing randomized delays added to domain-crossing signals. In FIG. 6A, SIG_A_CK1 is generated by CLK1 quickly enough to arrive before the next rising edge of CLK2 (left-most vertical dotted line) to be sampled by the first flip-flop in the synchronizer. Signal SIG_A_SY goes high after the randomized flip-flop delay, which in this case is 1+0 since the random function returned 0. After the next CLK2 edge, SIG_A_SY is clocked by the second flip-flop to drive SIG_A_CK2 high. The delay of the second flip-flop is the standard delay of 1. Signal SIG_A_CK2 can be sampled high by a state machine at the right-most vertical dotted line in the figure.

In FIG. 6B, SIG_A_CK1 is generated as shown in FIG. 6A by CLK1 quickly enough to arrive before the next rising edge of CLK2 (left-most vertical dotted line) to be sampled by the first flip-flop in the synchronizer. However, the clock-to-SIG_A_SY delay is greatly increased since #ff_delay1 is set to T2, the period of CLK2. Signal SIG_A_SY is delayed in going high by the randomized flip-flop delay, which in this case is 1+T2 since the random function returned 1. SIG_A_SY finally goes high after a delay of 1+T2 from the CLK2 edge at the left-most dotted line. This in last the next CLK2 edge, after the middle dotted line in the figure.

Since SIG_A_SY is delayed by an extra CLK2 period by the randomized delay, SIG_A_SY is not clocked by the second flip-flop until next CLK2 edge at the third dotted line. The second flip-flop then drives SIG_A_CK2 high after the standard delay of 1. Signal SIG_A_CK2 is sampled low rather than high by a state machine at the right-most vertical dotted line in the figure.

Both cases of SIG_A_CK2 being sampled high (FIG. 6A) and low (FIG. 6B) can be tested by setting #ff_delay1 to values that are separated by the CLK2 period. Both possible cases can then be verified, even when the exact delays are not yet known, such as early in the design cycle.

Pseudo-Code Example

The following pseudo-code segment shows adding a delay #ff_delay1 to the output of the first flip-flop in the SIG_A_CK1 synchronizer, and adding a delay #ff_delay2 to the output of the first flip-flop in the SIG_B_CK1 synchronizer. An arbitrary delay of #1 is set for the second flip-flops in each synchronizer.

```
always @(posedge clk2)
begin
SIG_A_SY<=#ff_delay1 SIG_A_CK1
SIG_A_CK2<=#1 SIG_A_SY;
...
SIG_B_SY<=#ff_delay2 SIG_B_CK1
SIG_B_CK2<=#1 SIG_B_SY;
end
```

The flip-flop delays #ff_delay1 and #ff_delay2 can be randomly set to either 1 (#1, the standard flip-flop delay) or to 1+T2, where T2 is the CLK2 cycle time or period. For two signals A and B, the possible combinations of #ff_delay1 and #ff_delay2 are:

ff_delay1=1 and #ff_delay2=1 (both sync in first cycle)
ff_delay1=1 and #ff_delay2=1+T2
ff_delay1=1+T2 and #ff_delay2=1
ff_delay1=1+T2 and #ff_delay2=1+T2 (both sync in second cycle)

The choices of delays for #ff_delay1 and #ff_delay2 can be randomly selected from among the possible combinations, or all possible combinations could be simulated.

Rather than manually assigning random delays to the synchronizer flip-flops, a simulation tool such as Verilog can be used to randomly assign these delays. The $random function in Verilog can be used with a seed or starting value to initiate the random function.

The following is an example of pseudo-code that randomly assigns delays of either 1 or T2 for the first flip-flop of each synchronizer from CLK1 to CLK2 domains:

```
reg cycle_delay1;
reg cycle_delay2;
...
always @(posedge resetn)
begin
```

```
cycle_delay1=$random(seed1); // either 0 or 1
cycle_delay2=$random(seed2);
...
end
assign ff_delay1=(cycle_delay1*T2)+1; // either 1 or
T2+1
assign ff_delay2=(cycle_delay2*T2)+1;
```

During chip reset, the cycle-delay parameter is set by the $random function to either 0 or 1, since the $random function is a binary-bit function in this example. This random number (0 or 1) is then multiplied by the clock period T2 of CLK2, the clock for the new domain. The arbitrary or standard flip-flop delay of 1 is then added in to get the randomized flip-flop delay #ff_delay1 or #ff_delay2.

The seed values seed1, seed2, etc. can be saved for each simulation run, allowing the simulation to be re-run with the same initial seeds when a failure is detected.

Figure 7:
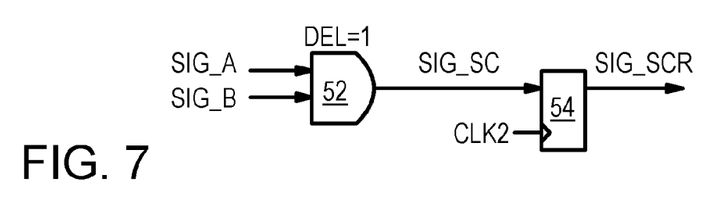
FIG. 7 shows a single-cycle and a multi-cycle path in a single clock domain.
Figure 8:
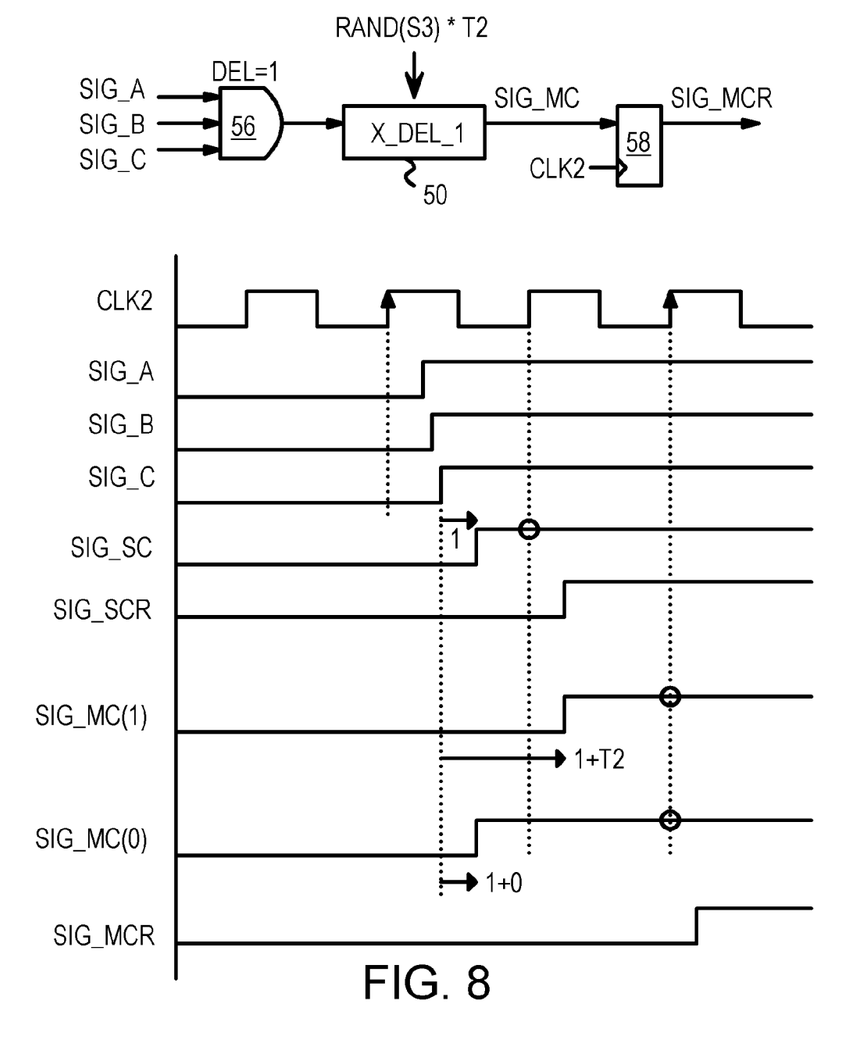
FIG. 8 is a waveform showing verification of a multi-cycle path using randomized added delays.

Multi-Cycle Delay Paths—FIGS. 7-8

Even within a single clock domain, some signals may require or be allowed more than one clock cycle to propagate to the intended destination. The inventor has realized that these multi-cycle paths can create similar logic hazards to those produced by the domain-crossing signals.

During logic synthesis, the designer can designate a path as a 2-cycle path rather than a standard 1-cycle signal path than must propagate within one clock period. The synthesis tool can stop optimizing the 2-cycle path once the synthesized path reaches the looser 2-cycle timing requirement.

It is possible that the propagation delay of the 2-cycle path may take less than one clock period. This can occur for short paths, when the clock is slowed down, or for faster processes and operating conditions. The design must still operate as expected when the 2-cycle paths are fast enough to meet the 1-cycle set-up time. A robust design should not rely on the 2-cycle path being slower than one cycle period.

The inventor has realized that a randomly added delay can be added to the multi-cycle paths to verify these paths. The randomized delays can help check for hazards caused by fast multi-cycle paths that might cause failures or unexpected results.

FIG. 7 shows a single-cycle and a multi-cycle path in a single clock domain. Signals A and B are generated in the CLK2 domain and applied to AND gate 52 which drives the D-input of flip-flop 54. Flip-flop 54 is clocked by CLK2 and outputs SIG_SCR. Since flip-flop 54 is clocked on each rising edge of CLK2, the path through AND gate 54 is a single-cycle path.

AND gate 56 receives signals A, B, C and drives the D-input of flip-flop 58 through randomized delay 50. Flip-flop 58 is also clocked by CLK2 and outputs SIG_MCR. However, the propagation from signals A, B, C to SIG_MC, the input to flip-flop 58, is intended to take just under 2 periods of CLK2. For example, flip-flop 58 may include a mux or enable input before the D-input to select signal SIG_MC only once every two clock edges of CLK2. This enable may be asserted every other cycle or some multiple of cycles. Such multi-cycle paths are common in pipelined processors.

For fast process conditions or slow clock rates, the propagation delay of the multi-cycle path to signal SIG_MC may take less than one clock period rather than between one and two or more clock periods. To test whether this can cause a timing problem in the design, randomized delay 50 is inserted in the simulated design in the multi-cycle path, such as after AND gate 56.

The delay through randomized delay 50 is either 0 or one clock period (T2). The delay value can be generated by multiplying the result of a binary random function with the clock period, or RAND(S3)*T2, where S3 is a seed value. Alternately, the delay through AND gate 56 can randomly be increased by zero or T2. For an arbitrary gate delay of 1, the delay through AND gate 56 to SIG_MC is either 1 or 1+T2.

FIG. 8 is a waveform showing verification of a multi-cycle path using randomized added delays. Signals A, B, C are generated from the second rising edge of CLK2 with varying delays. The single-cycle signal path SIG_SC is generated from signals A, B with a delay of 1, and meets the set-up time for being sampled by flip-flop 54 of FIG. 7 at the next (third) rising edge of CLK2. The output of the flip-flop, SIG_SCR goes high after this third clock edge since the input was sampled high.

The multi-cycle signal SIG_MC is also generated form signals A, B, C. The delay in generating SIG_MC is randomized. When the random function is 1, the waveform SIG_MC(1) is generated with a delay of 1+T2. SIG_MC(1) is not sampled until the fourth CLK2 rising edge, and easily meets the set up time for this edge since SIG_MC has almost two full cycles of CLK2 to propagate. SIG_MC(1) is low for the third rising edge of CLK2 since the propagation delay (1+T2) is so long.

When the random function is 0, the waveform SIG_MC (0) is generated with a delay of 1. SIG_MC(0) is not sampled until the fourth CLK2 rising edge, but is also high for the third rising edge of CLK2 since the delay is so short. Should there be any problem with SIG_MC becoming high so early, such as if SIG_MC were sampled by another flip-flop at the third rising edge of CLK2, this may be detected by the fast delay simulated for SIG_MC(0).

Since in this example of a 2-cycle path either case SIG_MC(0) or SIG_MC(1)—meets the set-up to the fourth rising edge of CLK2, flip-flop 58 of FIG. 7 samples SIG_MC high. Output SIG_MCR goes high after the flip-flop delay after the fourth rising edge of CLK2 as expected.

The above example shows the case when the multi-cycle path ends at the input to a flip-flop. When the multi-cycle path ends at a mid-point within combinatorial logic, any paths that pass through the combinatorial mid-point can be defined as a multi-cycle-path. Similarly, delays can also be used in an assign statement to achieve similar verification results.

Figure 9:
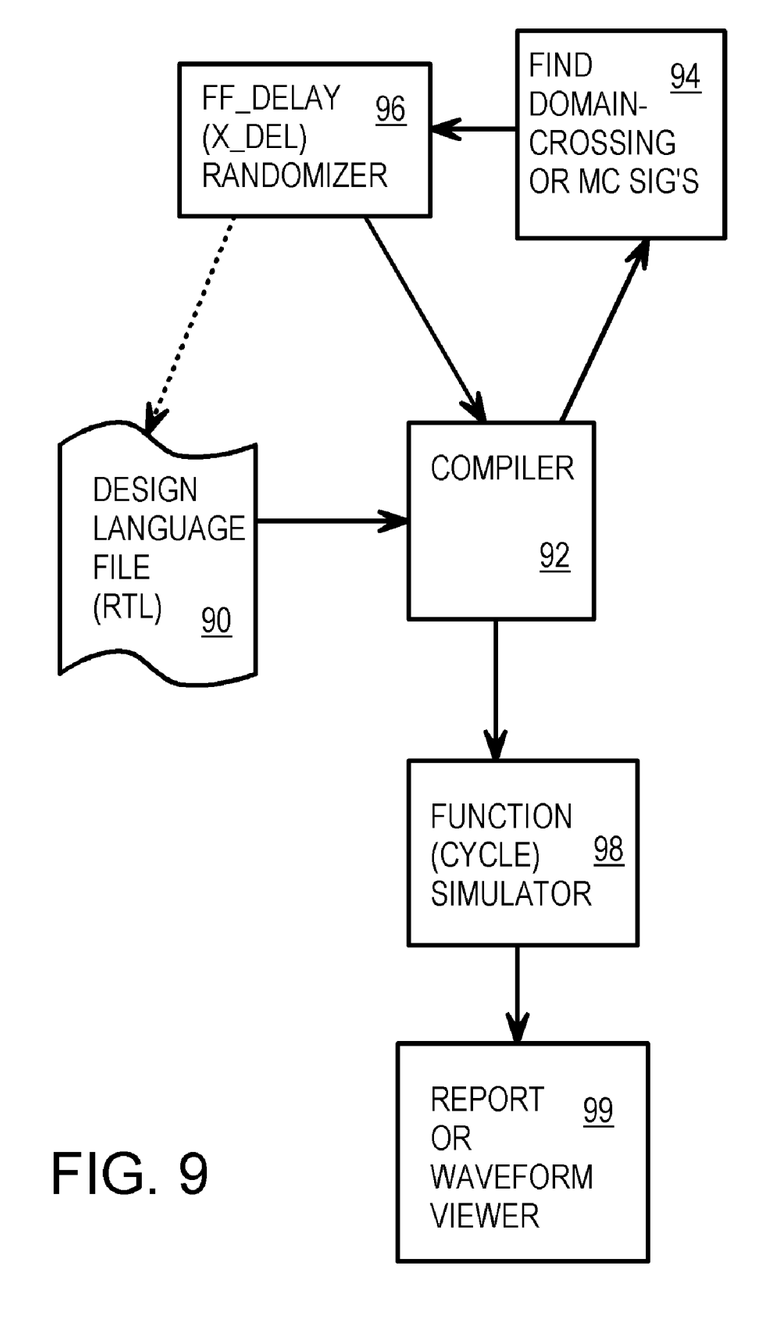
FIG. 9 is a block diagram of an early-stage design verifier that randomizes delays for domain-crossing and multi-cycle signals.

FIG. 9 is a block diagram of an early-stage design verifier that randomizes delays for domain-crossing and multi-cycle signals. The invention is especially useful as a front-end design tool used by the designer in the early phases of design, often before gate synthesis and before gate delays are generated. Before the chip is routed, the exact wiring and gate delays are unknown. However, the randomized delays can detect timing hazards caused by domain-crossing signals before actual delays are known. This can save the time and expense of re-routing or adjusting a routed design if the hazards are discovered later in the design process.

The designer defines the design by writing a text file in a specialized format or syntax, such as design-language file 90 for input to a Verilog or other HDL simulator. The text file resembles computer-program code, such as C++.

Design-language file 90 is input to compiler 92, which checks the syntax of statements, expands arrays, defines storage for variables (representing circuit nodes), etc. The design can be scanned to find signals crossing from one clock domain to another by scanner 94. The designer can define clock domains, or the software can follow clock signals to map out clock domains. Multi-cycle paths can be defined explicitly by the designer or found by scanner 94 in some embodiments.

Once locations of domain-crossing signals are found, delay randomizer 96 inserts randomized delays into the design-language code. Randomized delays can be added to the first flip-flop in a synchronizer, for example. Delay randomizer could also insert the pair of flip-flops for each synchronizer as well, updating design-language file 90 in some embodiments. The randomized delays can be inserted at simulation run-time.

Compiler 92 then assembles the final design, including the randomized delays from delay randomizer 96. Functional simulator 98 then performs a cycle-by-cycle simulation of the design compiled by compiler 92 using the functional descriptions of the statements in design-language file 90. Delays for generating signals using the functions can be included, such as for randomized delays. Functional simulator 98 keeps track of cycle times and writes the states of various signals to report file 90, or displays signals selected by the designer on a waveform viewer. Signal states could also be compared to expected states and mis-matches reported.

Figure 10:
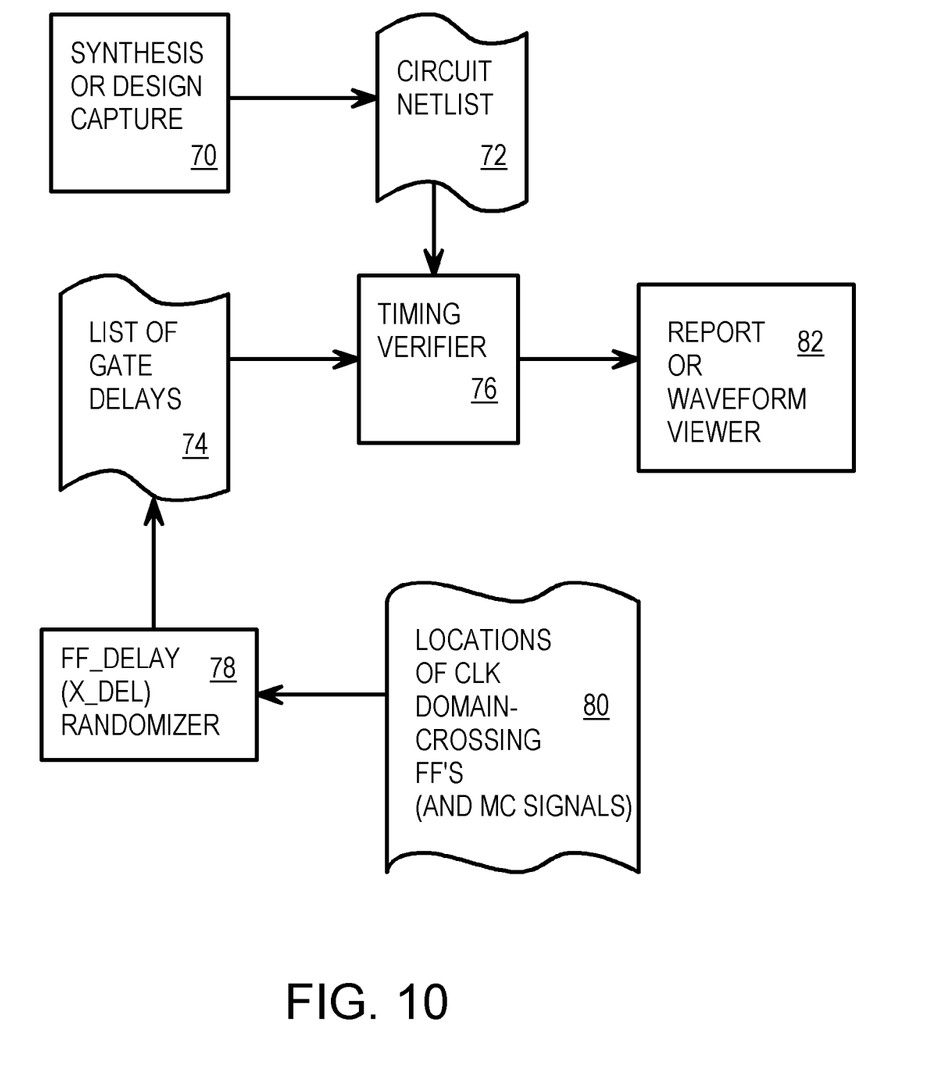
FIG. 10 is a block diagram of a back-end verifier that randomizes delays for domain-crossing and multi-cycle signals.

FIG. 10 is a block diagram of a back-end verifier that randomizes delays for domain-crossing and multi-cycle signals. While the invention can be used as a front-end tool in the early phases of design, it can also be used later in the design process to verify designs before committing to manufacture.

The early phases of the design flow include capture of the design, such as by schematic capture 70 and/or using a design language such as Verilog and synthesizing gates from the textual-based design language. Circuit netlist 72 is generated in one of a variety of formats that explicitly define block, gate, or transistor-level components and wiring connections among components.

The locations of clock-domain-crossing signals and any signals defined as multi-cycle signals are found and placed in location file 80. These locations could be explicitly defined by the designer or could be located automatically by a netlist scanner or compiler. The user could define the clock domains and the software then search for signals crossing from one clock domain to another.

Delay randomizer 78 inserts random delay elements in each synchronizer for each domain-crossing signal, such as show in FIG. 5. Random delays are also added for any multi-cycle signals as shown in FIG. 7. These delay elements can be delay statements that randomly change delays for the first flip-flop in a synchronizer, or for a gate in the multi-cycle path. The added delay elements are thus not real additional components that appear in the chip itself.

These randomized delays can alter gate delays 74, which are read by timing verifier 76 when simulating the design of netlist 72. Input and expected output files or test vectors can be applied to timing verifier 76, or test vectors can be generated such as by a sequencer or computer-code-type test-pattern exerciser.

The results of timing verifier 76 can be sent to the designer or test engineer using reporter 82, or the designer can view the results graphically using a waveform viewer. The designer can then adjust the design to fix any problems discovered by the randomized delays. For example, state machines can be modified to explicitly enter known state when unexpected inputs occur, such as domain-crossing signals being received at unexpected times simulated by the randomized delays.

Figure 11:
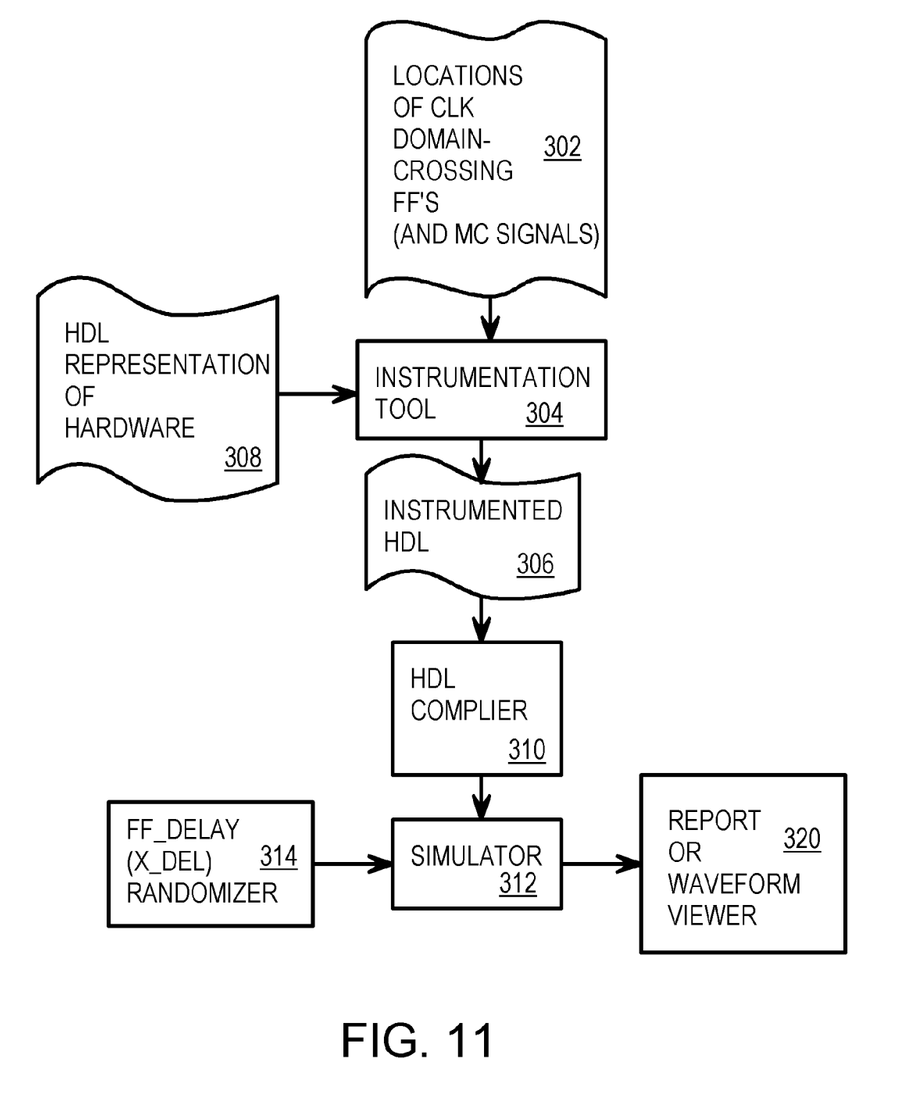
FIG. 11 is a more detailed block diagram of an early-stage design verifier that randomizes delays for domain-crossing and multi-cycle signals.

FIG. 11 is a more detailed block diagram of an early-stage design verifier that randomizes delays for domain-crossing and multi-cycle signals. The locations of domain-crossing signals and/or multi-cycle signals are loaded into location file 302. HDL file 308 contains the hardware-description-language file that describes the design and is produced by the designer. Instrumentation tool 304 produces instrumented HDL 306 which contains the random parameters for the domain-crossing and multi-cycle paths. These parameters have not yet been converted to actual delays.

HDL compiler 310 reads instrumented HDL 306 to provide input to simulator 312. Simulator 312 resolves the randomized delay parameters by using delay randomizer 314 to insert actual delay values into the simulated design at the locations identified by location file 302. Report 320 can include viewable waveforms and test coverage reports.

Alternate Embodiments

Several other embodiments are contemplated by the inventor. For example. The timing verifier can operate on functional statements in a design-language file such as RTL (Register-Transfer-Level), simple logic gates, or can be used with more exact timing models or even with analog-delay models or mixed models or simulators. The invention may be a stand-alone tool that scans designs for domain-crossing signals and inserts the random-delay statements into a design-language file, or even inserts the synchronizer flip-flops with the randomized delays.

Different arbitrary or standard delay values for the synchronizer flip-flops may be used, such as a delay of 2, 0.5, 5, etc. Different flip-flops may have different standard delays. Usually these arbitrary delays are non-zero. Delays can be expressed in nano-seconds or other time units, or can be an arbitrary tick. Rather than use random delays, both possibilities of added delays (0 or T2) can be simulated for each synchronizer. Fully simulating all possibilities rather than simulating a randomly-chosen subset of possible combinations may be feasible for smaller designs or faster simulators. Since only two possible delays need to be simulated for each domain-crossing signals, fully testing all possibilities is much more feasible than if a wide range of delay values were possible for each signal. The delay value can be generated fully at random or in a more directed manner. For example, with the consideration that certain sets of signal paths may induce more delays compared with the others, the generated delays from these signals to the flip-flops may be weighted towards T2 instead of 0 as an example. This approach may be desirable for big designs and with limited verification resources. Other tools such as Verisity's Specman may be used in combination.

Other test-vector generation tools (such as Specman by Verisity) may be introduced here to directly control the flip-flop delays to generate different possible combinations of delays. A test-coverage report can be generated and evaluated after simulation. A simple script or compiler can be created to facilitate this methodology automatically. Whenever a clock-domain crossing signal is detected, the randomized-delay can be added automatically to the RTL (Register-Transistor Level) or HDL (hardware descriptive language). RTL is more specific to the structural instead of behavioral coding style of hardware.

Randomized delays 42, 44 could be explicitly added as a component such as a delay line or non-inverting buffer, or it could be part of first flip-flops 16, 26 of FIG. 5. Different kinds of flip-flops can be used, such as J-K flip-flops, scan flip-flops with muxes on their D inputs, etc.

The randomized delays do not have to differ by exactly one clock period. Seed values for different domain-crossing or multi-cycle paths may be different to generate different randomized delay values. All the seed values may be recorded so that in case a bug is found, the simulation can be repeated by re-simulating with the same seed values. Multi-cycle paths of 3 or more clock periods can also be verified. The randomized delays can be selected from more than two possibilities, such as delays of 1, 1+T2, 1+2*T2, 1+3*T2, etc. The randomly added delay may be a value other than exactly the clock period. For example, a delay of 90% or 110% of the clock period could be used as T2. Such guard-banded delay values may further improve verification robustness. The length of the clock cycle can be varied, and the design tested at different clock frequencies. The clock period can be a parameter.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A domain-crossing verifier comprising:
   a design scanner, receiving a textual design file specifying functions to be performed by a chip being designed, for locating domain-crossing signals generated by a first clock and sampled by a second clock, wherein the first clock and the second clock are asynchronous;
   wherein the first clock has a first clock period and the second clock has a second clock period that differs from the first clock period;
   a delay randomizer that randomly selects as a random delay either a first delay value or a second delay value, the first and second delay values differing by the second clock period;
   wherein the delay randomizer multiplies a random binary number by a period of the second clock to generate the random delay; and
   a delay applicator, coupled to the delay randomizer, for applying the random delay to a first flip-flop, the first flip-flop being clocked by the second clock and receiving one of the domain-crossing signals generated by the first clock as an input;
   a simulator that simulates the textual design file using the random delays applied by the delay applicator to simulate logic hazards caused by domain-crossing signals;
   a reporter for reporting machine-generated results of the simulator to a user on a display or in a machine-generated report;
   wherein the delay applicator applies a series of random delays generated by the delay randomizer to a plurality of the domain-crossing signals located by the design scanner,
   wherein the chip defined by the textual design file is simulated using the random delays that differ by the second clock period to simulate logic hazards caused by domain-crossing signals.

2. The domain-crossing verifier of claim 1 wherein each domain-crossing signal passes through a synchronizer that includes the first flip-flop clocked by the second clock and generating a middle signal, and a second flip-flop that receives the middle signal and is clocked by the second clock to generate a re-synchronized signal that can be sampled by logic in a second domain clocked by the second clock;
   wherein the synchronizers are added to the textual design file by the design scanner or are already part of the textual design file.

3. The domain-crossing verifier of claim 2 further comprising:
   a cycle simulator, performing the functions defined by the textual design file on input stimuli, the cycle simulator delaying sampling of the domain-crossing signals by the second clock by the random delays generated by the delay randomizer,
   wherein the chip defined by the textual design file is simulated by the cycle simulator using the random delays that differ by the second clock period to simulate logic hazards caused by domain-crossing signals.

4. The domain-crossing verifier of claim 3 wherein the delay applicator adds delay parameters specifying the random delay generated by the delay randomizer to statements in the textual design file for statements that define the first flip-flop of synchronizers of domain-crossing signals.

5. The domain-crossing verifier of claim 4 further comprising:
   a compiler, reading the textual design file, for checking statements in the textual design file for proper syntax, and for generating a netlist defining the chip to be designed for input to the cycle simulator during simulation.

6. The domain-crossing verifier of claim 1 wherein the first delay value is zero and the second delay value is the second clock period, or wherein the first delay value is an arbitrary delay value and the second delay value is the arbitrary delay value added to the second clock period.

7. The domain-crossing verifier of claim 1 wherein the delay randomizer receives a seed value that specifies a starting point in a random-number sequence for generating the random delays.

8. A method for simulating domain-crossing signals that cross from a first clock domain to a second clock domain comprising:
   identifying a domain-crossing signal generated by a first clock in the first clock domain, and sampled by a second clock in the second clock domain;
   inserting an added delay to sampling of the domain-crossing signal by the second clock, wherein the added delay is selected from a first delay and a second delay, wherein the second delay is a period of the second clock greater than the first delay;

wherein inserting an added delay comprises multiplying a binary random number with the period of the second clock to generate the added delay;

wherein the steps of identifying a domain-crossing signal and inserting the added delay are repeated for other domain-crossing signals, wherein some domain-crossing signals have the second delay selected as the added delay while other domain-crossing signals have the first delay selected as the added delay;

simulating a design containing the domain-crossing signals having the added delays to sampling by the second clock; and reporting machine-generated simulation results to a user on a display or on a machine-generated report, whereby the design is simulated with added delays on domain-crossing signals wherein the added delays differ by the period of the second clock.

9. The method of claim 8 wherein simulating the design comprises simulating from a design-language file before logic gates are synthesized, whereby domain-crossing signals are verified before gate-level synthesis.

10. The method of claim 8 wherein simulating the design comprises simulating from a design-language file before physical layout of logic gates and wiring-connection routes are generated by a routing program, whereby domain-crossing signals are verified before layout and routing.

11. The method of claim 8 wherein the steps of identifying the domain-crossing signal and inserting the added delay are repeated for all domain-crossing signals.

12. The method of claim 11 wherein inserting an added delay comprises randomly selecting the first delay or the second delay as added delay, whereby added delays are selected randomly.

13. The method of claim 11 wherein for each added delay for each domain-crossing signal, the first delay is simulated during one simulation run, and the second delay is selected as the added delay during another simulation run, whereby added delays are exhaustively simulated for domain-crossing signals.

14. The method of claim 11 further comprising:

inserting a synchronizer onto the domain-crossing signal, wherein the synchronizer comprises a first flip-flop and a second flip-flop in series;

wherein inserting an added delay comprises adding the added delay to an output of the first flip-flop before an input to the second flip-flop, whereby synchronizer delays are randomized.

15. The method of claim 11 wherein the first clock is asynchronous to the second clock.

16. The method of claim 11 further comprising:

identifying a multi-cycle signal generated by the second clock in the second clock domain, wherein the multi-cycle signal is allowed more than one period of the second clock to propagate before being sampled by the second clock;

inserting an added delay to sampling of the multi-cycle signal by the second clock, wherein the added delay is selected from the first delay and the second delay, wherein the second delay is a period of the second clock greater than the first delay;

wherein simulating the design includes simulating the multi-cycle signals having the added delays to sampling by the second clock;

whereby the design is simulated with added delays on multi-cycle signals wherein the added delays differ by the period of the second clock.

17. A domain-crossing signal verifier comprising:

identifying means for identifying a domain-crossing signal generated by a first clock in a first clock domain, and sampled by a second clock in a second clock domain;

wherein the domain-crossing signal is generated by the first clock passes through a first flip-flop and a second flip-flop in a synchronizer, the first and second flip-flops clocked by the second clock;

delay randomizer means for generating a randomized delay for the first flip-flop in the synchronizer, wherein the randomized delay is randomly selected as either a first delay or a second delay wherein the second delay is the first delay added to a period of the second clock, the delay randomizer means also for multiplying a binary random number with the period of the second clock to generate the randomized delay;

repeat means for activating the delay randomizer means to generate randomized delays for other domain-crossing signals identified by the identifying means;

wherein some domain-crossing signals have the second delay selected as the randomized delay while other domain-crossing signals have the first delay selected as the randomized delay;

simulating means for simulating a design containing the domain-crossing signals having the randomized delays for first flip-flops in synchronizers on the domain-crossing signals before sampling by the second clock; and report means for reporting machine-generated results from the simulating means to a user on a display or on a machine-generated report, whereby the design is simulated with randomized delays on domain-crossing signals wherein the randomized delays differ by the period of the second clock.

18. The domain-crossing signal verifier of claim 17 further comprising:

multi-cycle means, receiving a list of multi-cycle signals that are allowed more than one period of the second clock for signal propagation, for activating the delay randomizer means to generate randomized delays for a gate in a path of each of the multi-cycle signals on the list of multi-cycle signals;

wherein the randomized delays are applied to multi-cycle signals for simulation by the simulating means.

* * * * *